(12) United States Patent
Jung

(10) Patent No.: US 6,529,060 B2
(45) Date of Patent: Mar. 4, 2003

(54) SEMICONDUCTOR INTEGRATED CIRCUIT DEVICE WITH VOLTAGE INTERFACE CIRCUIT

(75) Inventor: You-Shin Jung, Suwon (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/938,606

(22) Filed: Aug. 27, 2001

(65) Prior Publication Data

US 2002/0163365 A1 Nov. 7, 2002

(30) Foreign Application Priority Data

May 2, 2001 (JP) .......................................... 2001-23713

(51) Int. Cl.[7] .............................................. H03L 5/00
(52) U.S. Cl. ...................................... 327/333; 327/100
(58) Field of Search ................................ 327/100, 108, 327/333, 434

(56) References Cited

U.S. PATENT DOCUMENTS 5,216,292 A * 6/1993 Imazu et al. ................. 326/114
5,742,183 A * 4/1998 Kuroda .......................... 326/68
6,191,617 B1 * 2/2001 Park .............................. 326/83
6,275,075 B1 * 8/2001 Min ............................... 327/77
6,307,399 B1 * 10/2001 Lien et al. ................... 326/119
6,445,226 B2 * 9/2002 Taniguchi .................... 327/112

* cited by examiner

*Primary Examiner*—Kenneth B. Wells
*Assistant Examiner*—Cassandra Cox
(74) *Attorney, Agent, or Firm*—Lee & Sterba, P.C.

(57) ABSTRACT

A semiconductor integrated circuit device of an embodiment of the present invention includes a voltage converting transistor, connected between a pad and an internal circuit, for converting an input voltage applied to the pad into a voltage that is lower than an operating voltage of the internal circuit, a first pull-up transistor connected between the operating voltage and the pad, a second pull-up transistor connected between the operating voltage and a junction node connecting the voltage converting transistor with the internal circuit, and a control circuit for controlling the first and second pull-up transistors so that the first and second pull-up transistors operate complementary to each other, according to a voltage on the pad when the pad is in a floating condition.

35 Claims, 4 Drawing Sheets

Fig. 1

(Prior Art)

Fig. 2

(Prior Art)

SEMICONDUCTOR INTEGRATED CIRCUIT DEVICE WITH VOLTAGE INTERFACE CIRCUIT

BACKGROUND OF THE INVENTION

1. Field of the Invention

The present invention relates to an input circuit of a semiconductor integrated circuit device. More particularly, the present invention relates to a semiconductor integrated circuit device having a voltage interface circuit (or an input circuit), which converts an input voltage that is higher than a power supply voltage into a voltage that is lower than the power supply voltage.

2. Description of Related Art

The rapid development of semiconductor technology has continuously caused Metal-Oxide-Semiconductor (MOS) integrated circuit devices to become more highly integrated. In a fine structure of the MOS integrated circuit device, the thickness of a gate oxide is as small as 10–14 nm.

To prevent dielectric breakdown of the gate oxide and variation of a threshold voltage due to hot electrons generated during MOS transistor operation, a power supply voltage applied to the fine MOS integrated circuit device is made to be less than the power supply voltage applied to a conventional MOS integrated circuit device.

Figure 1:
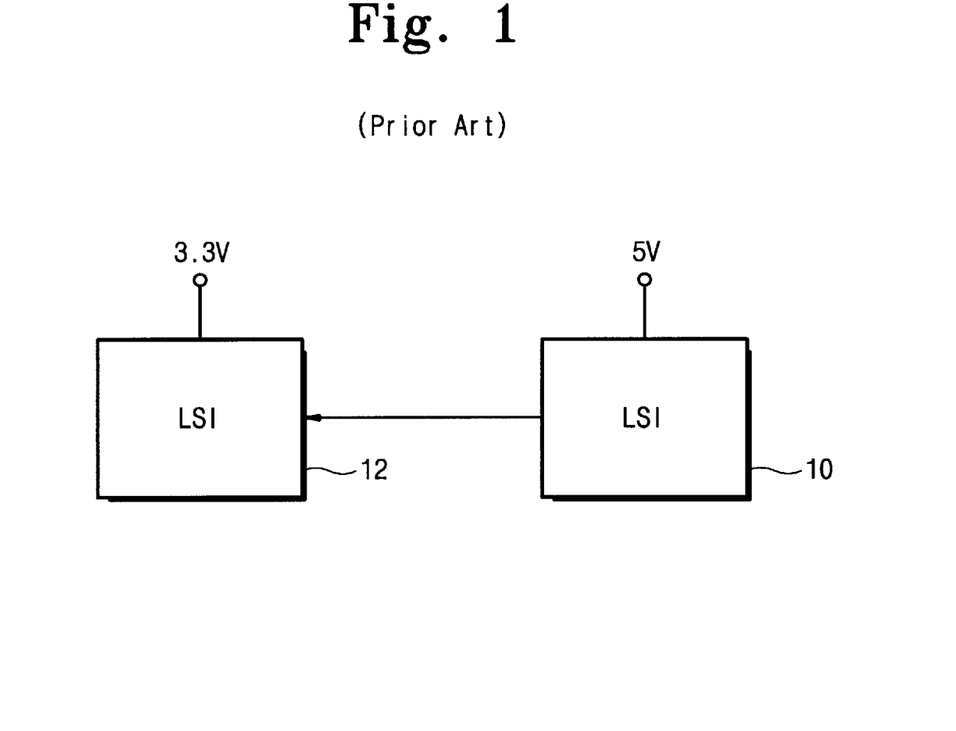
FIG. 1 illustrates a block diagram of an integrated circuit devices using different operating voltages according to the prior art.

FIG. 1 illustrates data transfer between semiconductor integrated circuit devices 10, 12 operating with different power supply voltages (for instance, 3.3 V and 5 V) according to the prior art. Binary data (or a digital signal) outputted to the semiconductor integrated circuit device 12 from the semiconductor integrated circuit device 10 has a low level signal of 0 V and a high level signal of 5 V. Thus, the semiconductor integrated circuit device 12 having the fine structure needs an input circuit to convert the 5 V-input signal to an input signal having an operating voltage or a power supply voltage of the semiconductor integrated circuit device 12 (3.3 V, for example). This input circuit for converting an input voltage is called a "3.3 V to 5 V power interface input circuit" or a "5 V-tolerant input/output circuit."

The 5 V-tolerant voltage interface circuit of the semiconductor integrated circuit for 3.3 V operation may be accomplished by a manufacturing process or circuit design.

In the former case, a conventional input circuit (for instance, general CMOS inverter) may be applied without modification by using the dual-gate oxide process. This process, however, increases the process cost.

In the latter case, using a single gate oxide thickness, it is possible to solve the aforementioned problem by connecting an N-channel MOS field effect transistor (NMOS transistor) with an input pin, an input terminal, or an input pad, receiving the 5 V-input signal.

Figure 2:
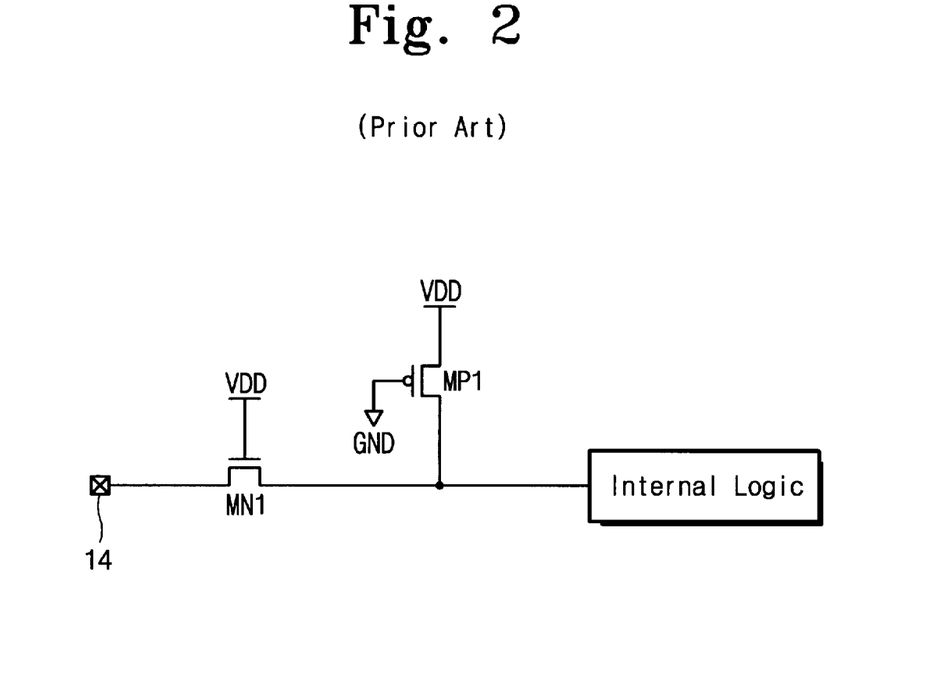
FIG. 2 illustrates a circuit diagram of a voltage interface circuit of a semiconductor integrated circuit device according to the prior art.

FIG. 2 illustrates a circuit diagram of a high voltage interface circuit of a semiconductor integrated circuit device according to the prior art.

The high voltage interface circuit includes a NMOS transistor (MN1) having a current path formed between an input pad 14 and an internal logic, and a gate connected to a power supply or operating voltage (VDD), and a PMOS transistor (MP1) having a current path formed between the power supply voltage (VDD) and a terminal of the NMOS transistor (MN1) connected to the internal logic, and a gate connected to a ground voltage (GND). A voltage higher than the power supply voltage (VDD) applied to the input pad 14 is converted to "VDD-Vthn" (Vthn indicates a threshold voltage of the NMOS transistor) by the NMOS transistor (MN1), and the converted voltage is applied to the internal logic.

While a data signal is transferred to the 3.3 V-semiconductor integrated circuit device 12 from the 5 V-semiconductor integrated circuit device 10 in FIG. 1, the signal transfer may be temporarily cut off. At this time, the input pad 14 shown in FIG. 2 comes to a floating condition. If the input pad 14 comes to the floating condition after an initial high level input voltage of 5 V has been applied to it, voltage on the input pad 14 becomes "VDD-Vthn" because the input pad 14 is driven by the PMOS transistor (MP1) through the NMOS transistor (MN1) in the floating condition.

That is, the voltage on the input pad 14 becomes "VDD-Vthn" when the input pad 14 is in the floating condition.

When the input pad 14 is in the floating condition and driven to "VDD-Vthn" by the PMOS transistor (MP1) (an operation condition known as the "pull-up mode"), there is a problem in that the input pad 14 is not driven to the full VDD level due to the Vthn drop of the NMOS transistor (MN1) at a transmission gate.

SUMMARY OF THE INVENTION

According to a feature of an embodiment of the present invention, there is provided a semiconductor integrated circuit device having a voltage interface circuit capable of driving an input pad to a full power supply voltage level in a pull-up mode.

According to another feature of an embodiment of the present invention, a semiconductor integrated circuit device is provided that includes a NMOS transistor having a first terminal connected to a pad, a second terminal connected to an internal circuit, and a gate connected to a power supply voltage used in the internal circuit.

The semiconductor integrated circuit device further includes a first PMOS transistor having a first terminal connected to the power supply voltage, a second terminal connected to the pad, and a gate connected to a first control signal.

The semiconductor integrated circuit device further includes a second PMOS transistor having a first terminal connected to the power supply voltage, a second terminal connected to the second terminal of the NMOS transistor, and a gate connected to a second control signal.

The semiconductor integrated circuit device further includes a voltage detection circuit for detecting whether a voltage on the pad is higher than the power supply voltage, and for generating a detection signal.

The semiconductor integrated circuit device further includes a control signal generating circuit for generating complimentary first and second control signals in response to the detection signal.

According to a device of an embodiment of the present invention, the input pad can be driven to the full power supply voltage level when the voltage on the input pad becomes lower than the power supply voltage in the floating condition.

These and other features of the present invention will be readily apparent to those of ordinary skill in the art upon review of the detailed description that follows.

DETAILED DESCRIPTION OF THE PREFERRED EMBODIMENTS

Korean Patent Application No. 2001-23713, filed May 2, 2001, and entitled "Semiconductor Integrated Circuit Device With Voltage Interface Circuit," is incorporated herein by reference in its entirety.

The present invention will now be described more fully with reference to the accompanying drawings, in which preferred embodiments of the invention are shown. This invention may, however, be modified in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

Figure 3:
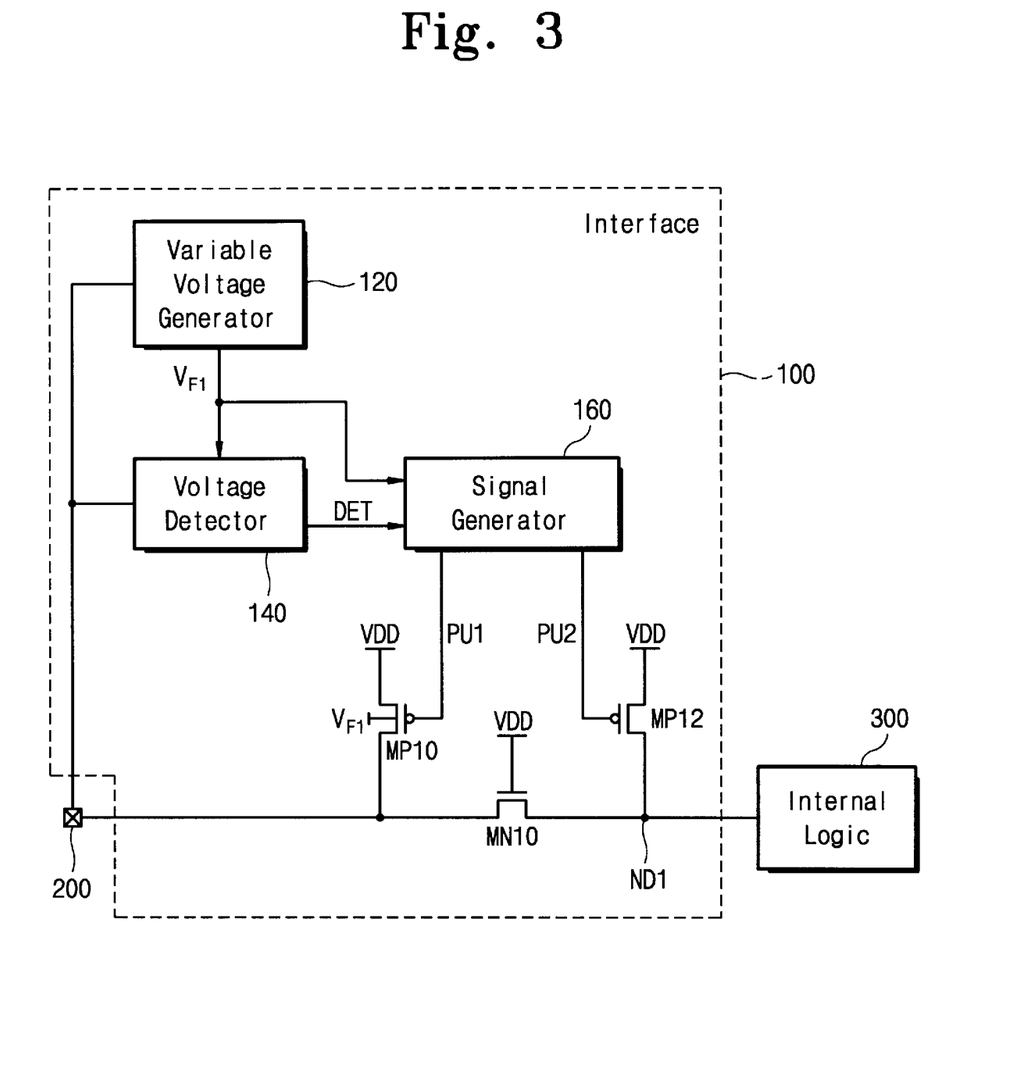
FIG. 3 illustrates a block diagram of a voltage interface circuit of a semiconductor integrated circuit device according to an embodiment the present invention.

FIG. 3 illustrates a block diagram of a voltage interface circuit of a semiconductor integrated circuit device according to an embodiment of the present invention. Referring to FIG. 3, a voltage interface circuit 100 is connected between an input pad 200 and an internal logic 300. The voltage interface circuit 100 includes a NMOS transistor (MN10) for voltage transfer and two PMOS transistors (MP10, MP12) operating as pull-up transistors. The NMOS transistor (MN10) has a current path formed between the input pad 200 and the internal logic 300 and a gate connected to a power supply voltage (VDD). The NMOS transistor (MN10) converts a high voltage applied to the input pad 200 into a voltage that is lower than the power supply voltage (VDD) (for instance, VDD-Vthn, wherein Vthn indicates a threshold voltage of the NMOS transistor).

The PMOS transistor (MP10) has a first terminal (drain/source) connected to the input pad 200 and a second terminal (source/drain) connected to the power supply voltage (VDD). The PMOS transistor (MP12) has a current path formed between the power supply voltage (VDD) and an internal node (ND1). The PMOS transistors (MP10, MP12) are controlled respectively by control signals (PU1, PU2) generated from a signal generator 160.

The voltage interface circuit 100 according to an embodiment of the present invention further includes a variable voltage generator 120, a voltage detector 140, and the signal generator 160. The variable voltage generator 120 is connected to the input pad 200, and generates a variable voltage (VF1) according to a voltage on the input pad 200 (hereafter referred to as "a pad voltage"). For instance, when the pad voltage is higher than the power supply voltage (VDD), the variable voltage (VF1) becomes equivalent to the power supply voltage (VDD), and when the pad voltage is lower than the power supply voltage (VDD), the variable voltage (VF1) becomes equivalent to the pad voltage.

Herein, the variable voltage (VF1) generated from the variable voltage generator 120 is used as a bulk voltage of the PMOS transistor (MP10). The voltage detector 140 is connected to the input pad 200, and generates a detection signal (DET) indicating whether the pad voltage is higher than the power supply voltage (VDD). The voltage detector 140 generates a low level detection signal when the pad voltage is higher than the power supply voltage (VDD), and generates a high level detection signal when the pad voltage is lower than the power supply voltage (VDD). The signal generator 160 generates the control signals (PU1, PU2) to control the PMOS transistors (MP10, MP12) respectively, in response to the detection signal (DET).

When the pad voltage is higher than the power supply voltage (VDD), the signal generator 160 generates the control signal (PU1) of a high level equal to the pad voltage and the control signal (PU2) of a low level equal to the ground voltage (GND). As a result, the PMOS transistor (MP10) is turned-off and the PMOS transistor (MP12) is turned-on. When the pad voltage is lower than the power supply voltage (VDD), the signal generator 160 generates the control signal (PU1) of a low level equal to ground voltage (GND) and the control signal (PU2) of a high level equal to the power supply voltage (VDD). As a result, the PMOS transistor (MP10) is turned-on and the PMOS transistor (MP12) is turned-off.

Figure 4:
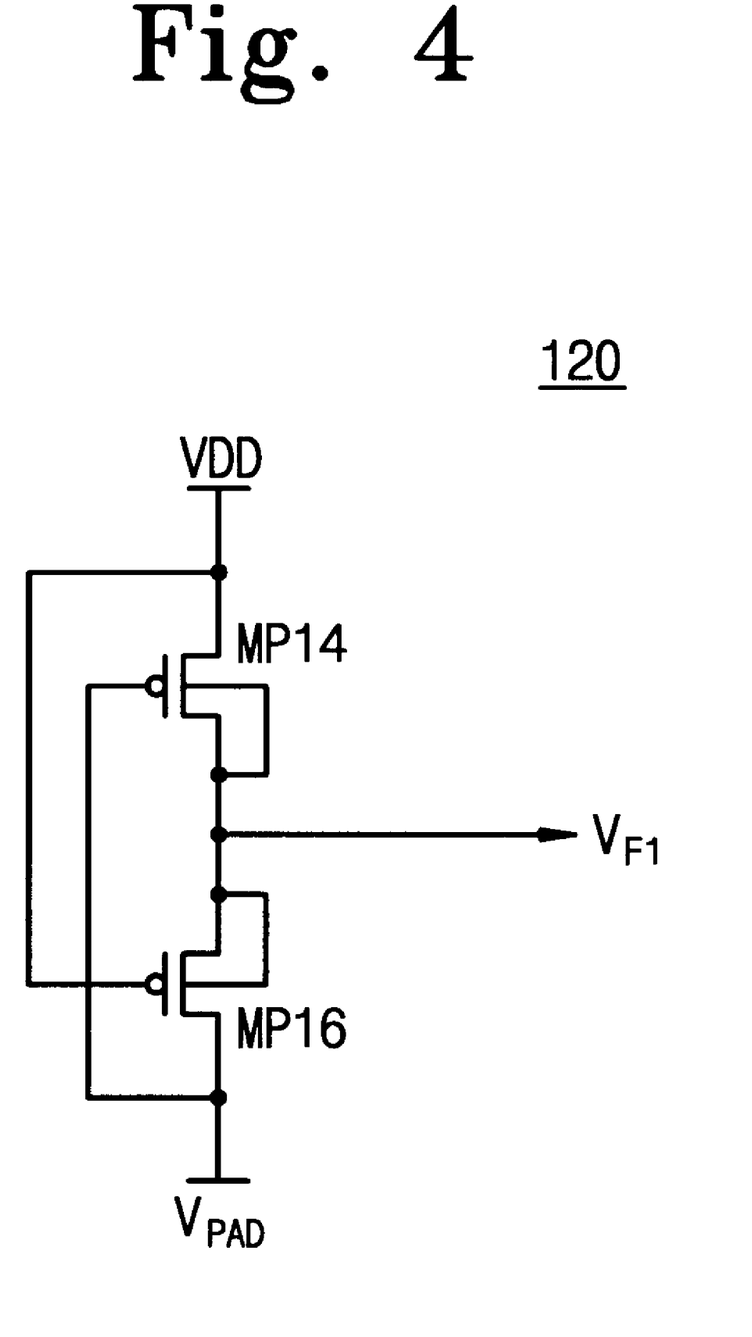
FIG. 4 illustrates a circuit diagram of a preferred embodiment of the variable voltage generator shown in FIG. 3.

FIG. 4 illustrates a circuit diagram of a preferred embodiment of the variable voltage generator shown in FIG. 3.

The variable voltage generator 120 of an embodiment of the present invention is comprised of two PMOS transistors (MP14, MP16). The PMOS transistor (MP14) has a current path formed between the power supply voltage (VDD) and an output terminal (VF1), and a gate connected to the pad voltage (VPAD). The PMOS transistor (MP16) has a current path formed between the output terminal (VF1) and the pad voltage (VPAD), and a gate connected to the power supply voltage (VDD). When the pad voltage (VPAD) is higher than the power supply voltage (VDD), the PMOS transistor (MP16) is turned-on, and the PMOS transistor (MP14) is turned-off. The variable voltage (VF1) becomes equal to the pad voltage (VPAD) through the PMOS transistor (MP16). On the contrary, when the pad voltage (VPAD) is lower than the power supply voltage (VDD), the PMOS transistor (MP16) is turned-off, and the PMOS transistor (MP14) is turned-on. The variable voltage (VF1) becomes equal to the power supply voltage (VDD) through the PMOS transistor (MP14).

Figure 5:
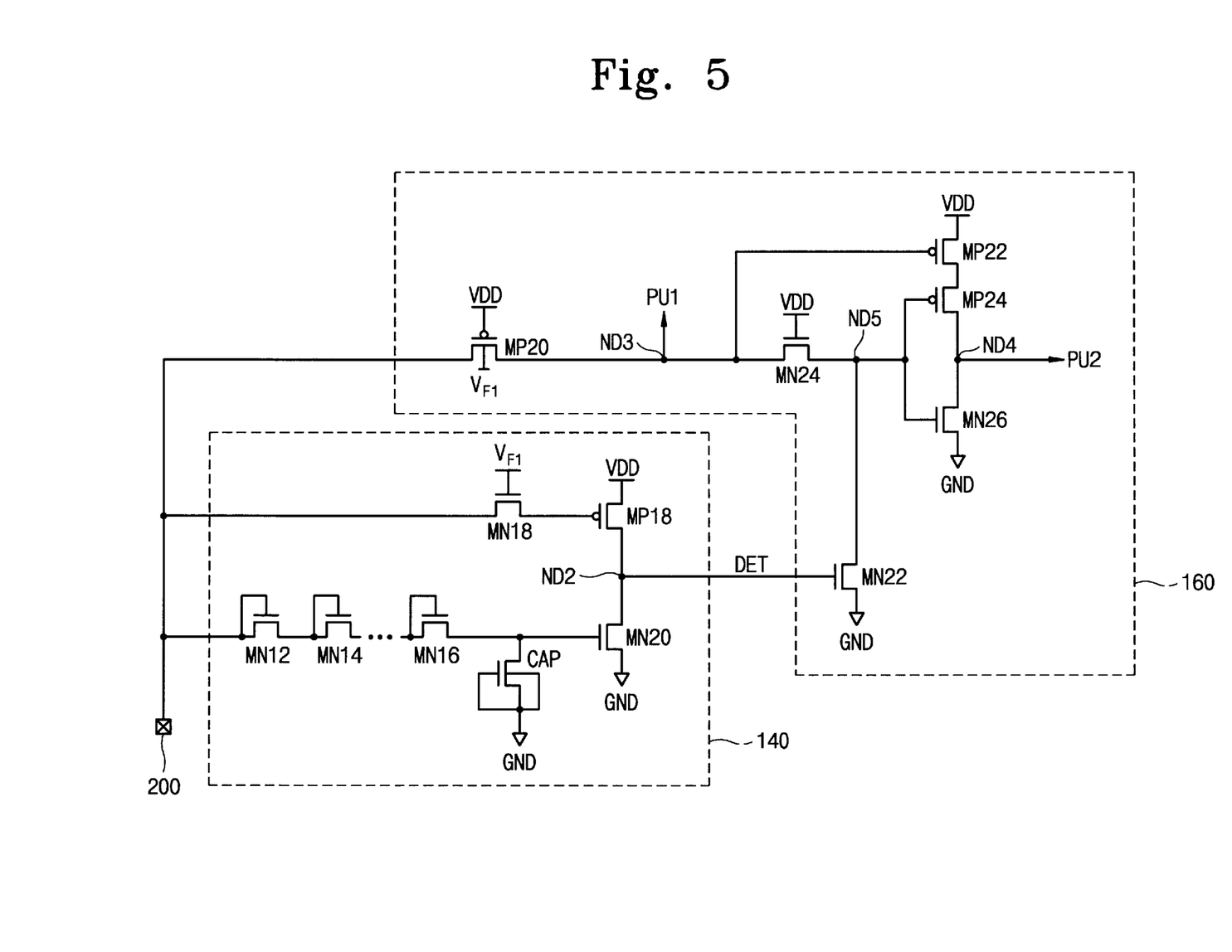
FIG. 5 illustrates a circuit diagram of a preferred embodiment of the voltage detector and the signal generator shown in FIG. 3.

FIG. 5 illustrates a circuit diagram of a preferred embodiment of the voltage detector and the signal generator shown in FIG. 3.

The voltage detector 140 of an embodiment of the present invention is comprised of a plurality of diode-connected MOS transistors (MN12–MN16), two NMOS transistors (MN18, MN20), a MOS capacitor (CAP), and a PMOS transistor (MP18).

The diode-connected MOS transistors (MN12–MN16) are serially connected between the input pad 200 and a gate of the NMOS transistor (MN20). The MOS capacitor (CAP) is connected between the gate of the NMOS transistor (MN20) and the ground voltage (GND). A current path of the NMOS transistor (MN20) is formed between an output terminal (ND2) for the detection signal (DET) and the ground voltage (GND). The PMOS transistor (MP18) has a current path formed between the power supply voltage (VDD) and the output terminal (ND2), and a gate connected to the input pad 200 through the NMOS transistor (MN18). The variable voltage (VF1) from the variable voltage generator 120 shown in FIG. 4 is supplied to a gate of the NMOS transistor (MN18).

Herein, the diode-connected MOS transistors (MN12–MN16) are configured to have a voltage drop corresponding to the power supply voltage (VDD).

The signal generator 160 of the present invention is comprised of output terminals (ND3, ND4) for the control signals (PU1, PU2) respectively, three NMOS transistors (MN22, MN24, MN26), and three PMOS transistors (MP20, MP22, MP24). The PMOS transistor (MP20) has a current path formed between the input pad 200 and the output terminal (ND3), and a gate connected to the power supply voltage (VDD). The variable voltage (VF1) from the variable voltage generator 120 is used as a bulk voltage of the PMOS transistor (MP20). The NMOS transistor (MN22) having a gate connected to the detection signal (DET) has a current path formed between an internal node (ND5) and the ground voltage (GND). The NMOS transistor (MN24) has a current path formed between the output terminal (ND3) and the internal node (ND5), and a gate connected to the power supply voltage (VDD). The PMOS transistors (MP22, MP24) have current paths formed serially between the power supply voltage (VDD) and the output terminal (ND4), and the NMOS transistor (MN26) has a current path formed between the output terminal (ND4) and the ground voltage (GND). A gate of the PMOS transistor (MP22) is connected to the output terminal (ND3), and gates of the PMOS and NMOS transistors (MP24, MN26) are connected to the internal node (ND5) commonly.

In an embodiment of the present invention, a reason for using the variable voltage (VF1) as the bulk voltages of the PMOS transistor (MP10) operating as a pull-up transistor and the PMOS transistor (MP20) of the signal generator 160 is to prevent internal diode turn-on problems of the PMOS transistors (MP10, MP20), which can occur when a voltage level higher than the power supply voltage (VDD) is applied to the input pad 200.

The operation of the semiconductor integrated circuit device according to an embodiment of the present invention will now be described in more detail with reference to FIG. 3 through FIG. 5.

Like a general voltage interface circuit or an input circuit, the voltage interface circuit 100 of the present invention performs a function of converting a high voltage applied to the input pad 200 into a voltage that is lower than the power supply voltage (VDD).

Moreover, when the input pad 200 having the high voltage is in a floating condition or a pull-up mode, the voltage interface circuit 100 can fully drive the input pad 200 to the power supply voltage (VDD).

More specifically, while a data signal is transferred to the input pad 200 from another integrated circuit device, the transfer of the data signal can be cut-off.

When the high voltage is applied to the input pad 200 in the floating condition, the variable voltage (VF1) generated from the variable voltage generator 120 becomes equal to the pad voltage (VPAD) since the pad voltage (VPAD) is higher than the power supply voltage (VDD).

In the voltage detector 140, the gate voltage of the PMOS transistor (MP18) becomes "VPAD-Vthn" through the NMOS transistor (MN18) since the gate voltage of the NMOS transistor (MN18), i.e., the variable voltage (VF1), is the same as the pad voltage (VPAD).

Assuming that the pad voltage (VPAD) is high enough, as compared with the power supply voltage (VDD), to cover the threshold voltages of PMOS and NMOS transistors, the PMOS transistor (MP18) is turned-off since "VPAD-Vthn" (Vthn is a threshold voltage of NMOS transistors) is higher than "VDD-Vthp" (Vthp is a threshold voltage of PMOS transistors), i.e., voltage difference between the gate and the source of the PMOS transistor (MP18) is smaller than the threshold voltage (Vthp) of the PMOS transistor (MP18). Also, the gate voltage of the NMOS transistor (MN20) becomes "VPAD-VDD" through the diode-connected MOS transistors (MN12–MN16), and the NMOS transistor (MN20) is turned-on.

Thus, the voltage detector 140 generates the detection signal (DET) of low level at the output terminal (ND2), and the NMOS transistor (MN22) is turned-off.

In the signal generator 160, since the source voltage (VPAD) of the PMOS transistor (MP20) is higher than the gate voltage (VDD) of the PMOS transistor (MP20), the PMOS transistor (MP20) is turned-on and the pad voltage (VPAD) is transferred to the output terminal (ND3). Since the gate of the NMOS transistor (MN24) is connected to the power supply voltage (VDD), the internal node (ND5) becomes "VDD-Vthn" and the NMOS transistor (MN26) is turned-on. Also, since the PMOS transistor (MP22) of which the gate is connected to the pad voltage (VPAD) is fully turned-off, the output terminal (ND4) becomes equal to the ground voltage (GND) through the NMOS transistor (MN26). Hence, the control signal (PU1) having the pad voltage (VPAD) is generated from the output terminal (ND3), and the control signal (PU2) having the ground voltage (GND) is generated from the output terminal (ND4).

Consequently, the PMOS transistor (MP10) is fully turned-off and may be protected from the high voltage applied to the input pad 200. Also, the input pad 200 can be driven to "VDD-Vthn" by the PMOS transistor (MP12) and the NMOS transistor (MN10).

In the floating condition, i.e., the pull-up mode, the pad voltage (VPAD) changes to "VDD-Vthn" from the voltage higher than the power supply voltage (VDD) by the operation explained above. During the voltage change of the pad voltage (VPAD), the variable voltage (VF1) outputted from the variable voltage generator 120 changes to the power supply voltage (VDD) when the pad voltage (VPAD) becomes lower than the power supply voltage (VDD). In the voltage detector 140, since the pad voltage (VPAD) is reduced by the power supply voltage (VDD) through the diode-connected NMOS transistors (MN12–MN16), the gate voltage of the NMOS transistor (MN20) becomes equal to the ground voltage (GND), and the NMOS transistor is turned-off. And, assuming that the threshold voltage (Vthn) of the NMOS transistor (MN18) is higher than the threshold voltage (Vthp) of the PMOS transistor (MP18), the PMOS transistor (MP18) is turned-on slightly. Thus, the detection signal (DET) of the power supply voltage (VDD) level is generated from the output terminal (ND2).

In the signal generator 160, the PMOS transistor (MP20) of which the gate is connected to the power supply voltage (VDD) is turned-off. The NMOS transistor (MN22) is turned-on by the detection signal (DET) having the power supply voltage (VDD), and the internal node (ND5) becomes equal to the ground voltage (GND) through the turned-on NMOS transistor (MN22). Also, the output terminal (ND3) becomes equal to the ground voltage (GND) through the NMOS transistor (MN24). As a result of this operation, the PMOS transistors (MP22, MP24) are turned-on, and the NMOS transistor (MN26) is turned-off.

Thus, the control signal (PU1) having the ground voltage (GND) is generated from the output terminal (ND3) and the control signal (PU2) having the power supply voltage (VDD) is generated from the output terminal (ND4).

Consequently, since the PMOS transistor (MP10) is turned-on by the control signal (PU1) with the ground voltage (GND) and the PMOS transistor (MP12) is turned-off by the control signal (PU2) with the power supply voltage (VDD), the input pad 200 can be driven to the power supply voltage (VDD) by the PMOS transistor (MP10).

As described above, the present invention allows the input pad to be fully driven to the power supply voltage in the pull-up mode.

The foregoing description of a preferred embodiment of the present invention has been disclosed herein and, although specific terms are employed, they have been used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. A semiconductor integrated circuit device comprising:
   a voltage converting transistor, connected between a pad and an internal circuit, for converting an input voltage applied to the pad into a voltage that is lower than an operating voltage of the internal circuit;
   a first pull-up transistor connected between the operating voltage and the pad;
   a second pull-up transistor connected between the operating voltage and a junction node connecting the voltage converting transistor with the internal circuit; and
   a control circuit for controlling the first and second pull-up transistors so that the first and second pull-up transistors operate complementary to each other, according to a voltage on the pad when the pad is in a floating condition.

2. The semiconductor integrated circuit device of claim 1, wherein the first and second pull-up transistors are PMOS transistors.

3. The semiconductor integrated circuit device of claim 2, wherein the control circuit detects the voltage on the pad and generates a first and a second control signal for controlling the first and second pull-up transistors respectively, so that the first and second control signals are activated complementary to each other.

4. The semiconductor integrated circuit device of claim 2, wherein the control circuit deactivates the first pull-up transistor and activates the second pull-up transistor when the voltage on the pad in the floating condition is higher than the operating voltage.

5. The semiconductor integrated circuit device of claim 2, wherein the control circuit activates the first pull-up transistor and deactivates the second pull-up transistor when the voltage on the pad in the floating condition is lower than the operating voltage.

6. The semiconductor integrated circuit device of claim 4, wherein the control circuit comprises a variable voltage generator generating a variable voltage according to whether the operating voltage is higher than the voltage on the pad, wherein the variable voltage is used as a bulk voltage of the first pull-up transistor.

7. The semiconductor integrated circuit device of claim 5, wherein the control circuit comprises a variable voltage generator generating a variable voltage according to whether the operating voltage is higher than the voltage on the pad, wherein the variable voltage is used as a bulk voltage of the first pull-up transistor.

8. The semiconductor integrated circuit device of claim 6, wherein the control circuit further comprises:
   a voltage detector for receiving the voltage on the pad and the variable voltage, wherein the voltage detector generates a detection signal indicating whether the voltage on the pad is higher than the operating voltage; and
   a signal generator connected to the pad, wherein the signal generator generates the first and second control signals in response to the detection signal.

9. The semiconductor integrated circuit device of claim 7, wherein the control circuit further comprises:
   a voltage detector for receiving the voltage on the pad and the variable voltage, wherein the voltage detector generates a detection signal indicating whether the voltage on the pad is higher than the operating voltage; and
   a signal generator connected to the pad, wherein the signal generator generates the first and second control signals in response to the detection signal.

10. The semiconductor integrated circuit device of claim 8, wherein the variable voltage generator comprises a first and a second PMOS transistors, the first PMOS transistor having a current path formed between the operating voltage and the variable voltage, and a gate connected to the pad, and the second PMOS transistor having a current path formed between the pad and the variable voltage, and a gate connected to the operating voltage.

11. The semiconductor integrated circuit device of claim 9, wherein the variable voltage generator comprises a first and a second PMOS transistors, the first PMOS transistor having a current path formed between the operating voltage and the variable voltage, and a gate connected to the pad, and the second PMOS transistor having a current path formed between the pad and the variable voltage, and a gate connected to the operating voltage.

12. The semiconductor integrated circuit device of claim 8, wherein the voltage detector generates a low level detection signal when the voltage on the pad is higher than the operating voltage, and generates a high level detection signal when the voltage on the pad is lower than the operating voltage.

13. The semiconductor integrated circuit device of claim 9, wherein the voltage detector generates a low level detection signal when the voltage on the pad is higher than the operating voltage, and generates a high level detection signal when the voltage on the pad is lower than the operating voltage.

14. The semiconductor integrated circuit device of claim 12, wherein the voltage detector comprises:
   an output terminal for outputting the detection signal;
   a plurality of diode-connected MOS transistors connected serially between the pad and an internal node;
   a capacitor connected between the internal node and a ground voltage;
   a PMOS transistor having a current path formed between the operating voltage and the output terminal;
   a first NMOS transistor having a current path formed between the pad and a gate of the PMOS transistor of the voltage detector, and a gate connected to the variable voltage; and
   a second NMOS transistor having a current path formed between the output terminal and the ground voltage, and a gate connected to the internal node.

15. The semiconductor integrated circuit device of claim 13, wherein the voltage detector comprises:
   an output terminal for outputting the detection signal;
   a plurality of diode-connected MOS transistors connected serially between the pad and an internal node;

a capacitor connected between the internal node and a ground voltage;

a PMOS transistor having a current path formed between the operating voltage and the output terminal;

a first NMOS transistor having a current path formed between the pad and a gate of the PMOS transistor of the voltage detector, and a gate connected to the variable voltage; and a second NMOS transistor having a current path formed between the output terminal and the ground voltage, and a gate connected to the internal node.

16. The semiconductor integrated circuit device of claim 14, wherein a sum of threshold voltages of the plurality of diode-connected MOS transistors is equal to the operating voltage.

17. The semiconductor integrated circuit device of claim 15, wherein a sum of threshold voltages of the plurality of diode-connected MOS transistors is equal to the operating voltage.

18. The semiconductor integrated circuit device of claim 12 wherein the signal generator comprises:

a first output terminal for generating the first control signal;

a second output terminal for generating the second control signal;

a first PMOS transistor having a current path formed between the pad and the first output terminal, and a gate connected to the operating voltage;

a first NMOS transistor having a current path formed between an internal node and a ground voltage, and a gate connected to the detection signal;

a second NMOS transistor having a current path formed between the first output terminal and the internal node, and gate connected to the operating voltage;

a third NMOS transistor having a current path formed between the second output terminal and the ground voltage, and a gate connected to the internal node; and a second and a third PMOS transistor having serial current paths between the operating voltage and the second output terminal, and having gates connected to the first output terminal and the internal node respectively.

19. The semiconductor integrated circuit device of claim 13, wherein the signal generator comprises:

a first output terminal for generating the first control signal;

a second output terminal for generating the second control signal;

a first PMOS transistor having a current path formed between the pad and the first output terminal, and a gate connected to the operating voltage;

a first NMOS transistor having a current path formed between an internal node and a ground voltage, and a gate connected to the detection signal;

a second NMOS transistor having a current path formed between the first output terminal and the internal node, and gate connected to the operating voltage;

a third NMOS transistor having a current path formed between the second output terminal and the ground voltage, and a gate connected to the internal node; and a second and a third PMOS transistor having serial current paths between the operating voltage and the second output terminal, and having gates connected to the first output terminal and the internal node respectively.

20. The semiconductor integrated circuit device of claim 18, wherein the variable voltage of the variable voltage generator is used as a bulk voltage of the first PMOS transistor.

21. The semiconductor integrated circuit device of claim 19, wherein the variable voltage of the variable voltage generator is used as a bulk voltage of the first PMOS transistor.

22. The semiconductor integrated circuit device of claim 20, wherein the first and second control signals become equal to a high level of the voltage on the pad, and a low level of the ground voltage respectively, when the voltage on the pad is higher than the operating voltage.

23. The semiconductor integrated circuit device of claim 21, wherein the first and second control signals become equal to a high level of the voltage on the pad, and a low level of the ground voltage respectively, when the voltage on the pad is higher than the operating voltage.

24. The semiconductor integrated circuit device of claim 20, wherein the first and second control signals become equal to a low level of the ground voltage, and a high level of the operating voltage respectively, when the voltage on the pad is lower than the operating voltage.

25. The semiconductor integrated circuit device of claim 21, wherein the first and second control signals become equal to a low level of the ground voltage , and a high level of the operating voltage respectively, when the voltage on the pad is lower than the operating voltage.

26. A semiconductor integrated circuit device comprising:

a first NMOS transistor having a first terminal connected to a pad, a second terminal connected to an internal circuit, and a gate connected to a power supply voltage used in the internal circuit;

a first PMOS transistor having a first terminal connected to the power supply voltage, a second terminal connected to the pad, and a gate connected to a first control signal;

a second PMOS transistor having a first terminal connected to the power supply voltage, a second terminal connected to the second terminal of the NMOS transistor, and a gate connected to a second control signal;

a voltage detection circuit for detecting whether a voltage on the pad is higher than the power supply voltage, and for generating a detection signal; and a control signal generating circuit for generating the first and second control in response to the detection signal, wherein the first and second control signals are activated so that the first and second control signals are complementary to each other.

27. The semiconductor integrated circuit device of claim 26, further comprising a variable voltage generating circuit for generating a variable voltage according to whether the power supply voltage is higher than the voltage on the pad, wherein the variable voltage is used as a bulk voltage of the first PMOS transistor.

28. The semiconductor integrated circuit device of claim 27, wherein the variable voltage generating circuit comprises:

a third PMOS transistor having a current path formed between the power supply voltage and the variable voltage, and a gate connected to the pad; and a fourth PMOS transistor having a current path formed between the pad and the variable voltage, and a gate connected to the power supply voltage.

29. The semiconductor integrated circuit device of claim 26, wherein the voltage detection circuit generates a low level detection signal when the voltage on the pad is higher than the power supply voltage, and generates a high level detection signal when the voltage on the pad is lower than the power supply voltage.

30. The semiconductor integrated circuit device of claim 29, wherein the voltage detection circuit comprises:
 an output terminal for outputting the detection signal;
 a plurality of diode-connected MOS transistors connected serially between the pad and an internal node;
 a capacitor connected between the internal node and a ground voltage;
 a fifth PMOS transistor having a current path formed between the power supply voltage and the output terminal;
 a second NMOS transistor having a current path formed between the pad and a gate of the fifth PMOS transistor, and a gate connected to the variable voltage; and
 a third NMOS transistor having a current path formed between the output terminal and the ground voltage, and a gate connected to the internal node.

31. The semiconductor integrated circuit device of claim 30, wherein the sum of threshold voltages of the plurality of diode-connected MOS transistors is equal to the power supply voltage.

32. The semiconductor integrated circuit device of claim 26, wherein the control signal generating circuit comprises:
 a first output terminal for generating the first control signal;
 a second output terminal for generating the second control signal;
 a third PMOS transistor having a current path formed between the pad and the first output terminal, and a gate connected to the power supply voltage;
 a second NMOS transistor having a current path formed between an internal node and a ground voltage, and a gate connected to the detection signal;
 a third NMOS transistor having a current path formed between the first output terminal and the internal node, and gate connected to the power supply voltage;
 a fourth NMOS transistor having a current path formed between the second output terminal and the ground voltage, and a gate connected to the internal node; and
 a fourth and a fifth PMOS transistors having serial current paths between the power supply voltage and the second output terminal, and gates connected to the first output terminal and the internal node, respectively.

33. The semiconductor integrated circuit device of claim 32, wherein the variable voltage of the variable voltage generating circuit is used as a bulk voltage of the third PMOS transistor.

34. The semiconductor integrated circuit device of claim 33, wherein the first and second control signals become equal to a high level of the voltage on the pad, and a low level of the ground voltage respectively, when the voltage on the pad is higher than the power supply voltage.

35. The semiconductor integrated circuit device of claim 33, wherein the first and second control signals become equal to a low level of the ground voltage, and a high level of the power supply voltage respectively, when the voltage on the pad is lower than the power supply voltage.

* * * * *